United States Patent [19]

Palara

[11] 4,072,979

[45] Feb. 7, 1978

[54] INTEGRATED POWER AMPLIFIER

[75] Inventor: Sergio Palara, San Martino di Ferrara, Italy

[73] Assignee: SGS-ATES Componenti Eletronici S.p.A., Agrate Brianza (Milan), Italy

[21] Appl. No.: 694,791

[22] Filed: June 10, 1976

[30] Foreign Application Priority Data

June 10, 1975   Italy ................................ 24160/75

[51] Int. Cl.$^2$ ......................... H01L 29/72; H03F 3/14
[52] U.S. Cl. ..................................... 357/36; 330/307; 357/51
[58] Field of Search ................. 330/38 M; 357/36, 51

[56]   References Cited
U.S. PATENT DOCUMENTS

| 3,609,460 | 9/1971 | Ollendorf et al. ............... 357/36 X |
| 3,619,741 | 11/1971 | Morgan ................................. 357/51 |
| 3,812,478 | 5/1974 | Tomisawa et al. ............... 357/51 X |
| 3,936,863 | 2/1976 | Olmstead ........................... 357/51 |

Primary Examiner—Lawrence J. Dahl

Attorney, Agent, or Firm—Karl F. Ross

[57]    ABSTRACT

An integrated power amplifier, composed of a multiplicity of elemental transistors epitaxially grown on a semiconductor chip, has base, emitter and collector terminals each connected in parallel to corresponding electrodes of the several elemental transistors. Each elemental transistor comprises two active emitter zones on opposite sides of a central contact zone conductively linked therewith by restricted connecting zones within the substrate, the contact zones of these transistors carrying emitter electrodes which are connected by a metallic strip to the emitter terminal. The array of transistors is divided into several parallel rows in each of which the width of the connecting zones progressively decreases from a transistor electrically closest to the base terminal to a transistor electrically closest to the emitter terminal, resulting in a progressive increase of the individual emitter resistances of these transistors to an extent compensating the voltage drop along the metallic strip between successive emitter electrodes.

3 Claims, 5 Drawing Figures

INTEGRATED POWER AMPLIFIER

FIELD OF THE INVENTION

My present invention relates to an integrated power amplifier composed of a multiplicity of elemental transistors which are epitaxially grown on a semiconductor chip.

BACKGROUND OF THE INVENTION

Conventional techniques of selective doping, metal deposition and photoengraving enable the mass production of such modular semiconductor units with active areas of different types and degrees of conductivity located between inactive regions along the chip surface. Emitters, bases and collectors of elemental transistors can thus be formed on the intrinsically conductive substrate and can be interlinked in part by conductor zones of predetermined resistivity (substantially less than that of the intrinsic regions) and in part by superposed metallic strips. Such strips may be used to connect respective amplifier terminals, common to all the elemental transistors, in parallel to a set of emitter, base and collector electrodes overlying the corresponding active areas of each of these transistors.

In a power amplifier of this type there are several desiderata to be satisfied, including particularly:
 a. high gain, also with large operating currents;
 b. low saturation voltage;
 c. absence of secondary breakdowns; and
 d. compact structure.

Requirement (a) is satisfied by making the emitter area of each elemental transistor as large as possible and uniformly distributing the current density in that area at all current levels. The satisfaction of requirement (b) depends essentially on the series resistance of the collector and may be achieved by various measures such as the interleaving of the collector and emitter areas to minimize the current path therebetween. Requirement (c) can be fulfilled by a balancing of the individual emitter currents with the aid of suitably dimensioned emitter resistors formed by certain zones of the chip. Requirement (d), finally, demands a well-planned layout and optimum activation of the electrode-supporting areas of the transistor array.

In order to obtain a large emitter area with uniform current distribution, it is known to divide the transistor array into several parallel rows and to dispose a metallic emitter lead along the centerline of each row between symmetrical sets of emitter areas. A pair of such areas form part of each elemental transistor and are linked with that emitter lead by narrow conductive zones perpendicular to that lead, these zones constituting the aforementioned emitter resistors. Such a layout is satisfactory from a viewpoint of high gain at elevated current levels and, particularly with several rows of this description connected in parallel between the base and emitter terminals, also affords good utilization of the available chip surface. Within a planar array of this type, however, imbalances still exist among the elemental transistors of a row as well as among the several rows; as a result, there is no optimum utilization of the available surface area. Moreover, especially at high current levels, these imbalances may lead to local overheating entailing the risk of secondary breakdowns.

OBJECT OF THE INVENTION

The object of my present invention, therefore, is to provide an improved integrated power amplifier of the type referred to which satisfies all the aforestated desiderata and obviates the drawbacks just mentioned.

SUMMARY OF THE INVENTION

In accordance with my present invention, the resistive zones linking the emitters of the elemental transistors of any row with a common metallic strip, serving as the emitter lead for that row, have resistances which vary progressively along the row for substantially equalizing the current distribution among the elemental transistors of each row. More particularly, these resistances should progressively increase from the first transistor of the row, i.e. the one whose base is electrically closest to the base terminal of the amplifier, to the last transistor whose emitter is electrically closest to the common emitter terminal; the term "electrically closest", of course, means the least amount of resistance between the electrode and the terminal involved.

BRIEF DESCRPTION OF THE DRAWING

The above and other features of my invention will now be described in detail with reference to the accompanying drawing in which.

SPECIFIC DESCRIPTION

Figure 1:
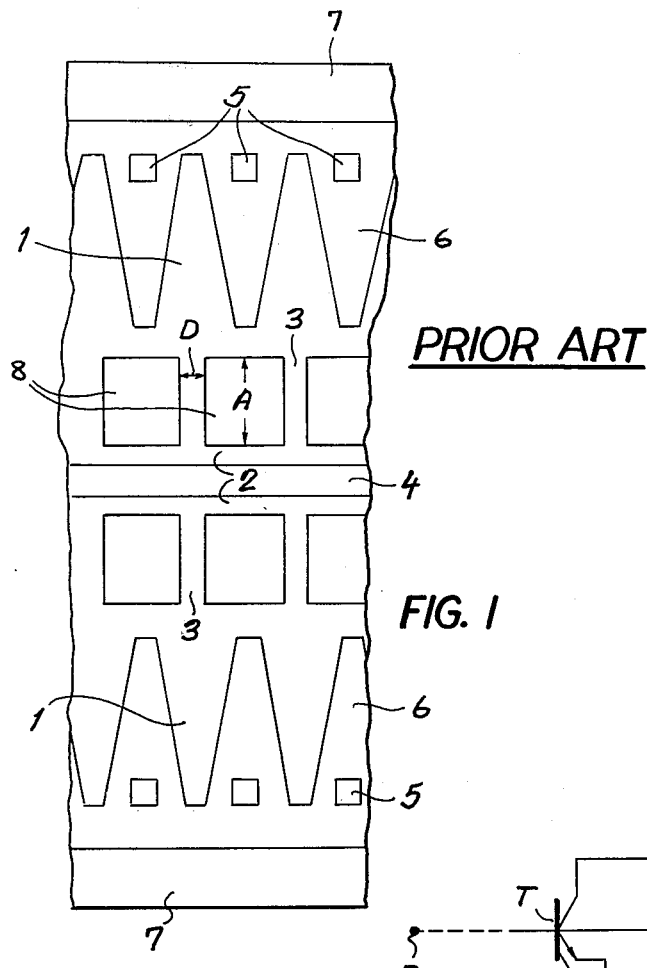
FIG. 1 is a diagram showing the layout of part of a conventional power amplifier of the general type here considered.

FIG. 1 shows part of a row of elemental transistors in a planar array of such transistors constituting a conventional power amplifier of the integrated-circuit type discussed above. Each elemental transistor of this amplifier comprises two lateral active emitter areas 1 constituted by a serrated layer of one conductivity type epitaxially grown on a base layer 6 of the opposite conductivity type, other layers 7 of the first conductivity type forming associated collectors. (Usually, in such transistor structures, the collector layers extend underneath the base layers; see, for example, U.S. Pat. No. 3,619,741.) A central zone 2 of emitter material is linked with the active zones 1 via narrow rectangular zones 3 of limited conductivity flanked by highly resistive regions 8 of intrinsic material. The central zone 2 is overlain by a metallic strip 4 extending to a common emitter terminal indicated at E in FIG. 2. Electrodes 5 on base layer 6 are similarly connected to a common base terminal B (FIG. 2) via conductor strips that have not been illustrated. There is also a collector terminal C, likewise shown in FIG. 2, connected to zones 7 in an analogous manner.

Figure 2:
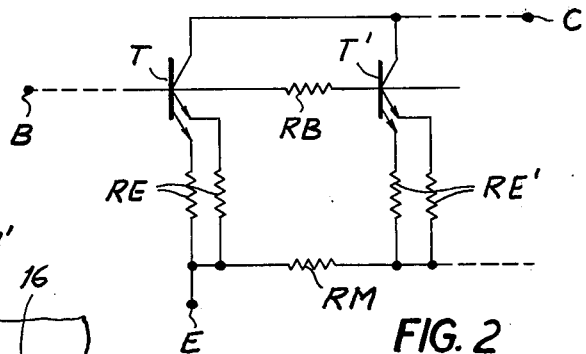
FIG. 2 shows the equivalent circuit for the amplifier section illustrated in FIG. 1.

The rectangular linking zones 3 throughout the array of elemental transistors are all of the same length A and width D so as to represent identical emitterresistances $R_E$; FIG. 2 shows two elemental transistors T, T' each with a pair of such emitter resistances $R_E$, $R_E'$ constituted by the two transverse zones 3 flanking the central zone 2. The bases of transisitors T and T' are separated by a resistor RB representing the resistance of the sections of metallic strip (not shown) which interconnect the base electrodes 5 of successive elemental transistors. Base resistance RB is small in comparison with the mutually identical emitter resistances RE and RE'. The central emiter zone 2, which is in direct contact with strip 4 and is therefore connected to terminal E without intervening resistance RE, has not been illustrated in the diagram of FIG. 2 and with its underlying base layer 6 may be considered part of a separate elemental transistor.

The metallic strip 4 interconnecting the emitters of the several transistors T, T' of a row also forms a resistance RM between consecutive transistors, i.e. between the junctions of their transverse zones 3 with the central zone 2. In order to minimize the effect of this series resistance RM upon the current distribution within the transistor array, it has heretofore been the practice to make the length A of the connecting zones 3 much larger than their width D, thereby greatly increasing the resistance ratio RE/RM. Such a dimensioning, however, results in a wide separation of the two active emitter zones 1 on opposite sides of central zone 2 and in incomplete utilization of the available surface area, in view of the presence of relatively large regions 8 or intrinsic conductivity.

Figure 4:
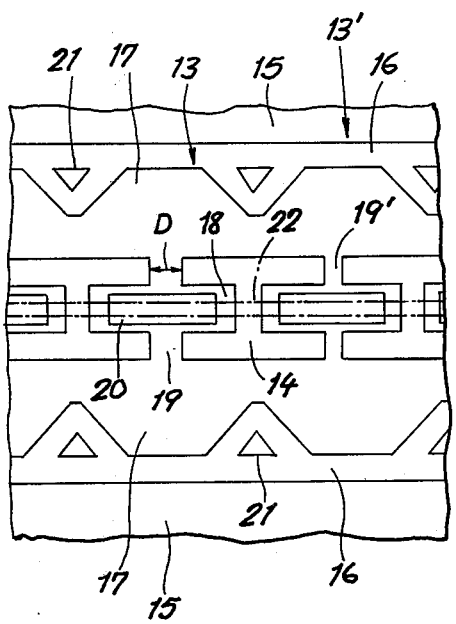
FIG. 4 is a diagram comparable to that of FIG. 1, showing a section of the layout of FIG. 3 drawn to a larger scale.
Figure 3:
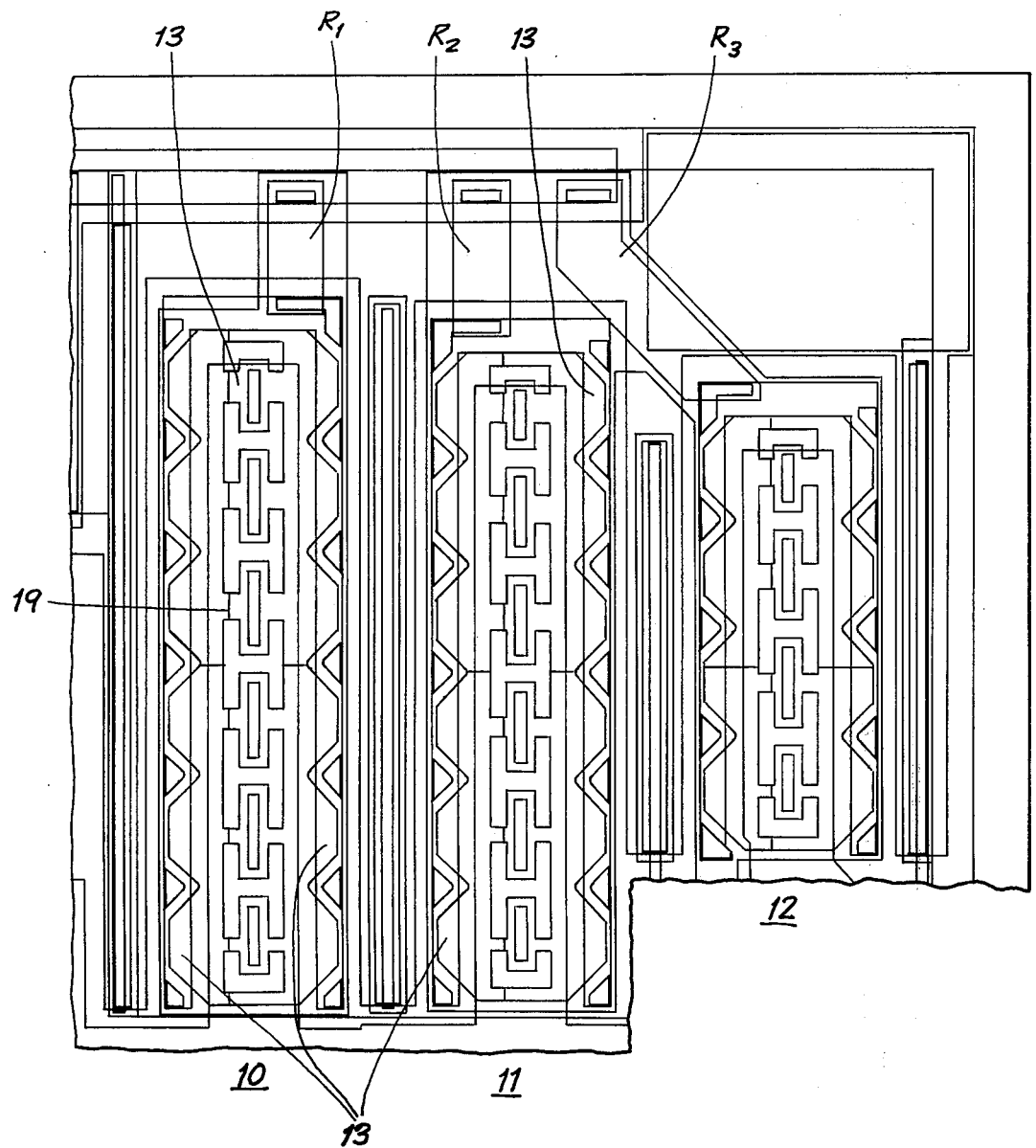
FIG. 3 shows the layout of a representative portion of a power amplifier embodying my present improvement.
Figure 5:
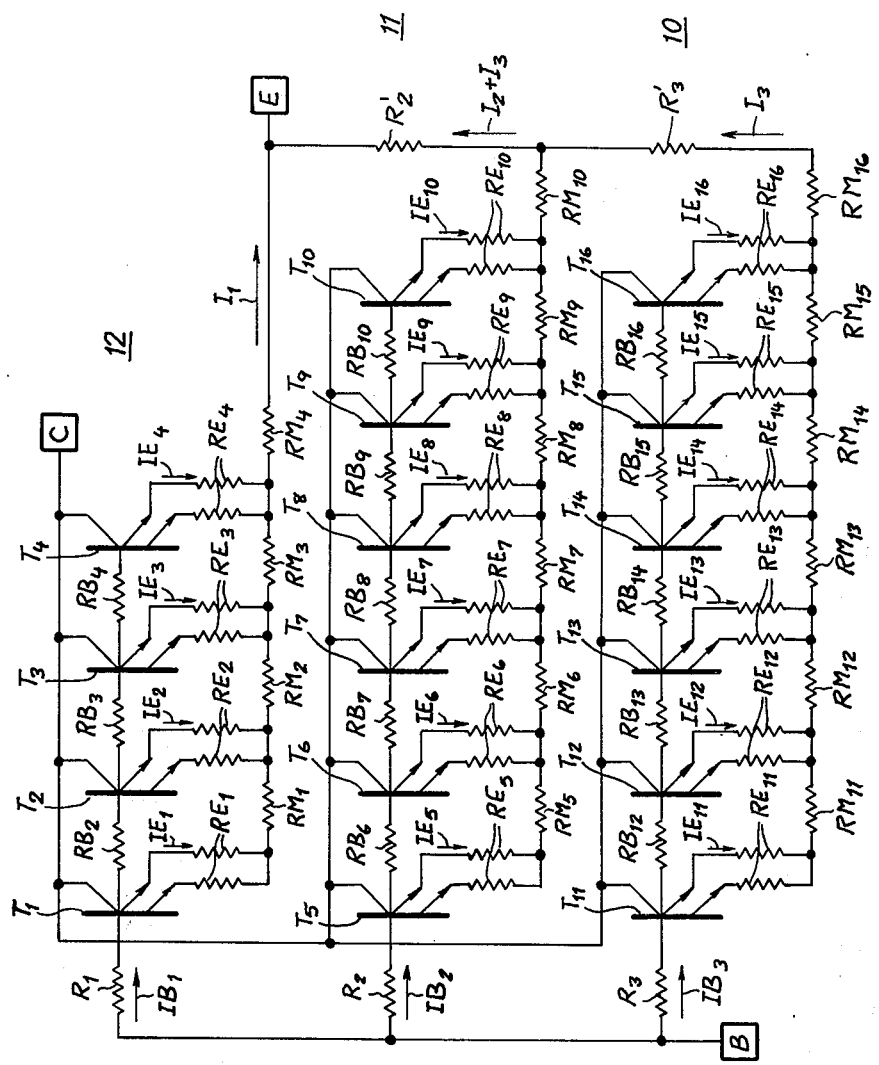
FIG. 5 shows the equivalent circuit for the amplifier portion included in the layout of FIG. 3.

Reference will now be made to FIGS. 3 – 5 representing an improved power amplifier according to my invention, it being understood that the equivalent circuit of FIG. 2 applies also to this improvement.

FIG. 3 shows as substantial part of a semiconductor chip with an array of elemental transistors 13 divided into three parallel rows 10, 11 and 12 of six, six and four transistors, respectively. FIG. 3 also shows three resistive zones $R_1$, $R_2$, $R_3$, formed in the usual manner by the diffusion of impurities into the substrate, through which the bases of the uppermost transistors of these rows are connected to a common terminal B not shown in FIG. 3 but illustrated in FIG. 5.

As will be more clearly apparent from the detailed showing of FIG. 4, each elemental transistor 13 comprises two active emitter zones 17 deposited on base layers 16 between collector zones 15. The active lateral emitter zones 17 of each elemental transistor communicate with a central zone 18, carrying a metallic emitter electrode 20, via resistive zones 19 (also formed by the controlled diffusion of impurities) which are generally similar to the zones 3 of FIG. 1 but are of considerably reduced length. The emitter electrodes 20 of a row are interconnected by an overlying metallic strip 22 extending along the centerline of the row. It will be noted that adjacent transistors 13, 13' are separated from each other by generally H-shaped intrinsic regions 14 occupying substantially less space than the two intrinsic areas 8 present between adjoining transistors in the conventional layout of FIG. 1.

In accordance with an important feature of my invention, the width D of the transverse zones 19, 19' of adjoining transistors 13, 13' decreases progressively from one end of the row to the other, i.e. from left to right in FIGS. 4 and 5. This narrowing of the transverse connecting zones represents a progressive increase of the emitter resistances represented thereby. The same progressive decrease in the width D can be observed, from the top down, in each of the rows 10–12 of the array shown in FIG. 3. Thus, the lowest emitter resistances are provided at the transistors proximal to respective base of input resistors $R_1 - R_3$ of the three rows. Conversely, the highest emitter resistances are tied to the transistors proximal to the common terminal E (FIG. 5) which lie at the bottom of each row in FIG. 3.

In the equivalent-circuit diagram of FIG. 5, the four transistors of row 12 have been designated $T_1 - T_4$, those of row 11 are labeled $T_5 - T_{10}$ and those of row 10 have been marked $T_{11} - T_{16}$. Resistors $R_1$, $R_2$ and $R_3$ lie between the common base terminal B and the bases of transistors $T_1$, $T_5$ and $T_{11}$, respectively; they are traversed by input currents $IB_1$, $IB_2$ and $IB_3$. Consecutive transistors of rows 12, 11 and 10 have their bases separated by resistors $RB_2 - RB_4$, $RB_6 - RB_{10}$ and $RB_{12} - RB_{16}$ whose significance has been explained in connection with resistor RB of FIG. 2. Each elemental transistor has a collector tied to common terminal C, in a manner not relevant to my present improvement, and has two emitters with series resistors $RE_1 - RE_{16}$ formed by the aforementioned zones 19. The intervening sections of strips 22 (FIG. 4) are represented in FIG. 5 by series resistors $RM_1 - RM_{16}$; emitter terminal E is connected to resistor $RM_{10}$ through another resistor $R'_2$ and to resistor $RM_{16}$ through the series combination of this latter resistor with a further resistor $R'_3$ (which could be combined with resistor $RM_{16}$).

Transistor rows 12, 11 and 10 have output currents $I_1$, $I_2$ and $I_3$ respectively traversing resistors $RM_4$, $RM_{10} + R'_2$ and $RM_{16} + R'_3 + R'_2$ downstream of the last transistors $T_4$, $T_{10}$ and $T_{16}$ of these rows. Each of these output currents is composed of the individual emitter currents passing through the resistance pairs $RE_1 - RE_4$, $RE_5 - RE_{10}$ and $RE_{11} - RE_{16}$ of the corresponding groups of elemental transistors.

Uniformization of the current distribution requires that the input or base currents $IB_1 - IB_3$ have relative magnitudes proportional to the numbers of parallel transistors in their respective rows. In the illustrated array, therefore $$I_1 : I_2 : I_3 = 4 : 6 . 6 = 2 : 3 : 3 \tag{1}$$

Furthermore, the sums of the voltage drops in the input and the output of each row should be the same; thus:

$$R_1 IB_1 + RM_4 I_1 = R_2 IB_2 + RM_{10} I_2 + R'_2 ) I_2 I_3) = =$$
$$R_3 IB_3 + (RM_{16} + R'_3) I_3 + R'_2 (I_2 + I_3) \tag{2}$$

Given a gain G for a chosen emitter current, the values of base currents $IB_1 - IB_3$ can be determined; with due consideration of thermal and electrical stability, one of the three input resistances $R_1 - R_3$ can be freely selected. With resistances $RM_4$, $RM_{10}$ and $RM_{16}$ fixed by the spacing of the emitter electrodes 20 and the dimensions of conductor strip 22 (FIG. 4), the two other input resistances can be derived from equations (1) and (2).

Let $Vbe_n$ and $Vbe_{n+1}$ be the base/emitter voltages of an upstream and a downstream elemental transistor immediately adjoining each other in a row, with $RE_n$ and $RE_{n+1}$ denoting the corresponding emitter resistances, $RM_n$ being the intervening strip resistance, $IE_n$ and $IE_{n+1}$ being the emitter currents and $RB_{n+1}$ being the corresponding interbase resistance traversed by an interval base current $IB_{n+1}$. Kirchhoff's law then requires that $$Vbe_n + (RE_n + 2RM_n)IE_n = Vbe_{n+1} + RB_{n+1}IB_{n+1} + RE_{n+1}IE_{n+1} \quad (3)$$

With $RB_{n+1}$ negligible in comparison with $RE_n$ and $Re_{n+1}$, and with identical transistors so that $Vbe_n = Vbe_{n+1}$, equation (3) simplifies to $$(RE_n + 2RM_n)IE_n + RE_{n+1}IE_{n+1} \quad (4)$$

Equation (4) means that the different between the voltage drops across consecutive emitter resistances $RE_n$, $RE_{n+1}$ (the latter corresponding to RE' in FIG. 2) equals twice the voltage drop across the intervening strip resistance $RM_n$, the factor of 2 being of course due to the presence of two emitter resistances on opposite sides of strip 22 in each elemental transistor 13.

Finally, in order to establish the desired current-distribution pattern one should observe the relationship $$\frac{Z_n}{Z_{n+1}} = \frac{IE_n}{IE_{n+1}} = \frac{RE_{n+1}}{RE_n + 2RM_n} \quad (5)$$

where $Z_n$ and $Z_{n+1}$ are the areas of the active emitter zones of two consecutive elemental transistors.

From the gain G and a given value for the overall emitter current on terminal E, in combination with the known emitter areas $Z_n$ and $Z_{n+1}$, it is possible to obtain particular values for all the variables of equations (4) and (5) except emitter resistances $RE_n$, $RE_{n+1}$. Selection of one such emitter resistance, again with due consideration of thermal and electrical stability as well as the physical characteristics of the elemental transistors, then provides the remaining values; care should be taken in that selection to avoid overloading of the central zones 18 in comparison with the other emitter areas and to prevent crowding, with maintenance of a suitable current gradient in the active emitter zones.

Naturally, the geometrical configuration of the transistor array may be varied and other modifications may be introduced in the disclosed modular unit without departing from the spirit and scope of my invention. Thus, for example, the elemental transistors have been indicated as being of the NPN type, yet analogous principles apply to PNP transistors.

I claim:

1. In an integrated transistor structure wherein a semiconductor body comprises a base layer of one conductivity type, a collector layer of the opposite conductivity type adjoining said base layer, and an emitter layer of said opposite conductivity type on a surface of said base layer, said emitter layer forming a multiplicity of emitter areas arrayed in at least one row and constituting respective elemental transistors with corresponding portions of said base and collector layers, each emitter area including a central zone flanked by a pair of lateral zones which are connected with said central zone by narrower transverse zones, said central zones being interconnected by a conductor strip extending to a common emitter terminal at one end of said row, said collector and base layers being respectively connected to a common collector terminal and to a common base terminal, the improvement wherein the widths of said transverse zones decrease progressively from a first elemental transistor at said one end of said row to a last elemental transistor at the other end thereof with a corresponding increase in the resistances of said transverse zones for substantially equalizing the current distribution among the elemental transistors of said row.

2. The improvement defined in claim 1 wherein the resistances of said transverse zones of successive elemental transistors along said row differ from each other to an extent substantially compensating the voltage drop existing along an intervening section of said strip between the central zones of the emitter areas of said successive elemental transistors upon energization thereof.

3. The improvement defined in claim 1 wherein said emitter areas are arrayed in a plurality of rows, the first elemental transistor of each row having its base-layer portion connected to said common base terminal by way of a respective input resistor, said conductor strip of each row being connected to said common emitter terminal by way of a respective output resistor downstream of the last elemental transistor thereof, said input and output resistors being so dimensioned that the sum of the voltage drops thereacross is substantially the same for all rows upon energization of said elemental transistors.

* * * * *